US012796544B2

(12) United States Patent
Lin et al.

(10) Patent No.: US 12,796,544 B2
(45) Date of Patent: Nov. 10, 2026

(54) INTEGRATED CIRCUIT PACKAGE AND METHOD

(71) Applicant: Taiwan Semiconductor Manufacturing Co., Ltd., Hsinchu (TW)

(72) Inventors: Po-Yao Lin, Zhudong Township (TW); Chia-Hsiang Lin, Zhubei (TW); Chien-Sheng Chen, Hsinchu (TW); Kathy Wei Yan, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 849 days.

(21) Appl. No.: 18/149,985

(22) Filed: Jan. 4, 2023

(65) Prior Publication Data

US 2024/0145433 A1 May 2, 2024

Related U.S. Application Data

(60) Provisional application No. 63/421,384, filed on Nov. 1, 2022.

(51) Int. Cl.

*H10W 90/00* (2026.01)
*H10W 70/09* (2026.01)
*H10W 74/10* (2026.01)
*H10W 72/00* (2026.01)

(52) U.S. Cl.

CPC .......... *H10W 90/00* (2026.01); *H10W 74/117* (2026.01); *H10W 70/09* (2026.01); *H10W 72/884* (2026.01); *H10W 74/142* (2026.01); *H10W 90/724* (2026.01); *H10W 90/754* (2026.01)

(58) Field of Classification Search

CPC . H10W 90/00; H10W 90/724; H10W 90/754; H10W 74/117; H10W 74/142; H10W 72/884; H10W 70/09

See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |
| 9,048,233 | B2 | 6/2015 | Wu et al. |

(Continued)

FOREIGN PATENT DOCUMENTS

| | | | |
|---|---|---|---|
| TW | 201830598 | A | 8/2018 |
| TW | 202226511 | A | 7/2022 |
| TW | 202236544 | A | 9/2022 |

*Primary Examiner* — Timor Karimy
(74) *Attorney, Agent, or Firm* — Slater Matsil, LLP

(57) ABSTRACT

A package structure includes a first die and a second die embedded in a first molding material, a first redistribution structure over the first die and the second die, a second molding material over portions of the first die and the second die, wherein the second molding material is disposed between a first portion of the first redistribution structure and a second portion of the first redistribution structure, a first via extending through the second molding material, wherein the first via is electrically connected to the first die, a second via extending through the second molding material, wherein the second via is electrically connected to the second die and a silicon bridge electrically coupled to the first via and the second via.

20 Claims, 17 Drawing Sheets

50

110

(56) References Cited

U.S. PATENT DOCUMENTS

| | | | | |
|---|---|---|---|---|
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 10,199,346 | B2 | 2/2019 | Teh et al. | |
| 2020/0118984 | A1 | 4/2020 | Chen et al. | |
| 2020/0357768 | A1 | 11/2020 | Shih et al. | |
| 2021/0305163 | A1* | 9/2021 | Akkinepally | H10W 70/09 |
| 2021/0407962 | A1 | 12/2021 | Kim et al. | |
| 2022/0028788 | A1 | 1/2022 | Pietambaram et al. | |
| 2022/0189880 | A1 | 6/2022 | Pietambaram et al. | |
| 2022/0278032 | A1 | 9/2022 | Pietambaram et al. | |
| 2022/0285278 | A1 | 9/2022 | Ecton et al. | |

* cited by examiner

50

100

100

100

100

110

110

INTEGRATED CIRCUIT PACKAGE AND METHOD

PRIORITY CLAIM AND CROSS-REFERENCE

This application claims the benefit of U.S. Provisional Application No. 63/421,384, filed on Nov. 1, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
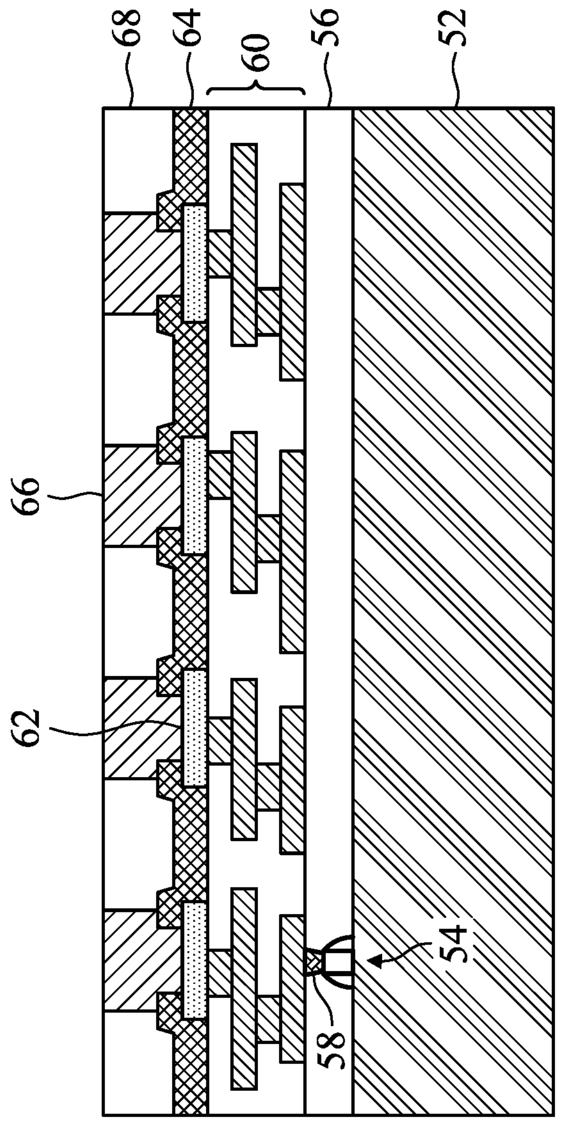
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods applied to forming an integrated circuit package that includes a front-side redistribution structure over a first integrated circuit die and a second integrated circuit die. A portion of the front-side redistribution structure is removed to form an opening in the front-side redistribution structure, and a first Through Insulator Via (TIV) and a second TIV are formed in the opening, wherein the first TIV is electrically connected to the first integrated circuit die and the second TIV is electrically connected to the second integrated circuit die. A molding material is formed around the first TIV and the second TIV to fill in the opening, and a silicon bridge is formed over and coupled to the first TIV and the second TIV. Advantageous features of one or more embodiments disclosed herein may allow for a reduction in the length of the routing interconnect between the first integrated circuit die and the second integrated circuit die. In addition, the first TIV and second TIV can comprise larger diameters, which allows for a reduction in electrical resistance and an enhancement in electrical performance. Further, the molding material formed around the first TIV and the second TIV provides high stiffness, and this prevents cracking in the molding material and improves reliability of the integrated circuit package.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, baseband transceiver die, a sensor die, a micro-electro-mechanical-system (MEMS) die, a signal processing die (e.g., digital signal processing (DSP) die), a front-end die (e.g., analog front-end (AFE) dies), a high-performance computing (HPC) die, an artificial intelligence (AI) die, an automotive die, the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

FIGS. 2 through 14 illustrate cross-sectional views of intermediate steps during a process for forming a first package component 100, in accordance with some embodiments. One or more of the integrated circuit dies 50 are packaged to form an integrated circuit package that may also be referred to as an integrated fan-out (InFO) package.

Figure 2:
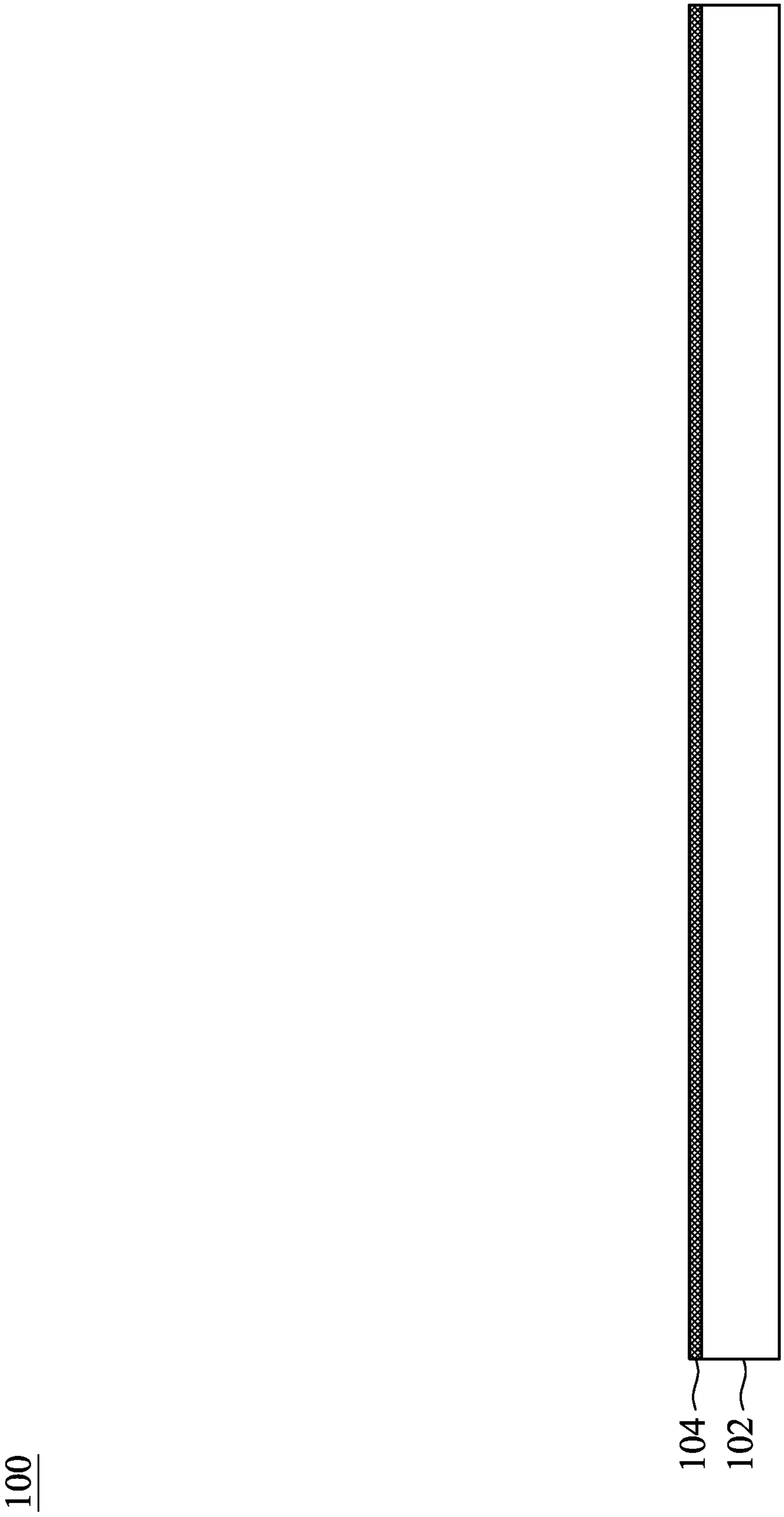
FIGS. 2 through 16 illustrate cross-sectional views of intermediate steps during a process for forming a package in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, and multiple packages may be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 3:
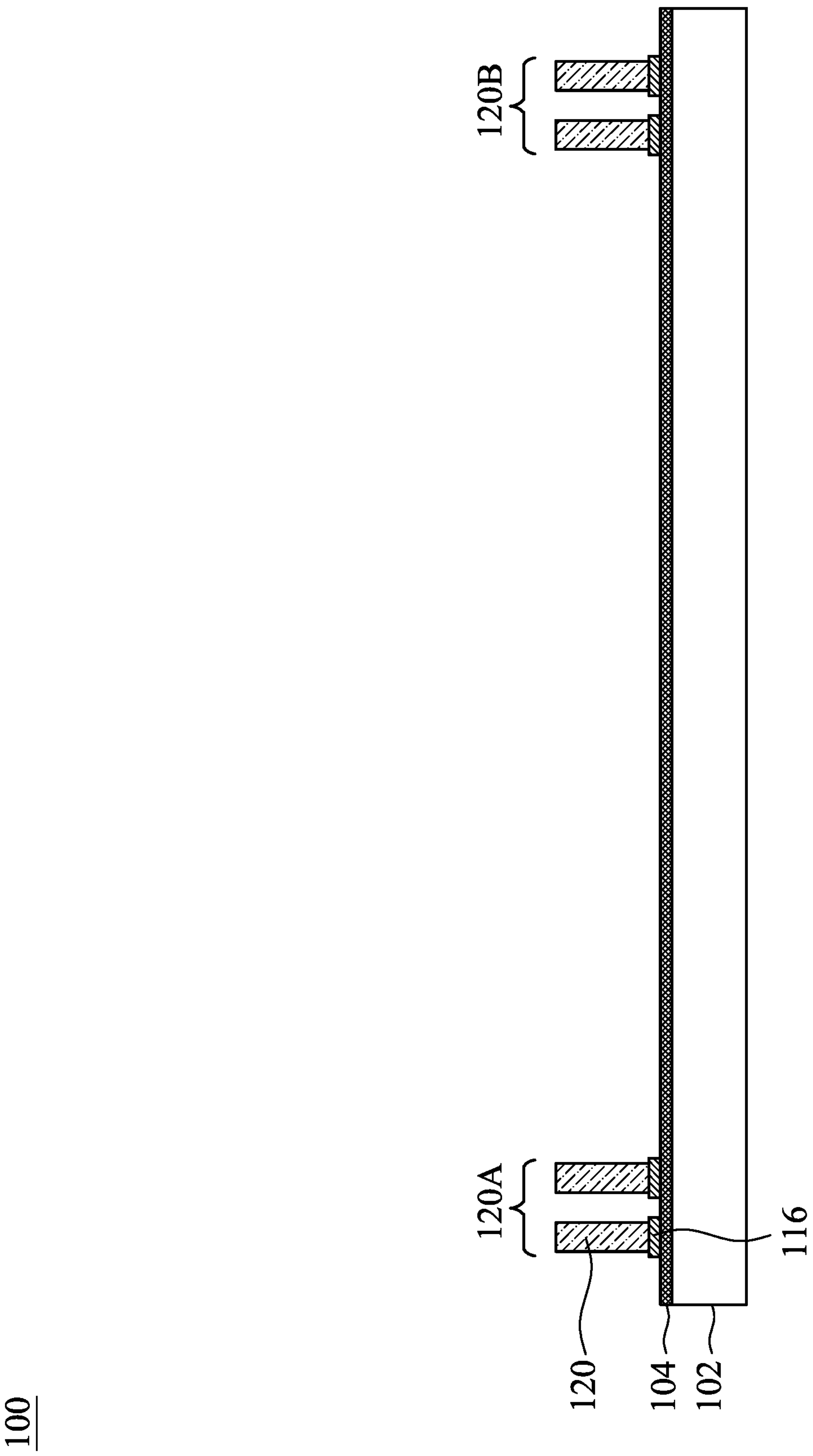

In FIG. 3, conductive vias 120 are formed extending away from a top surface of the release layer 104. As an example to form the conductive vias 120, a seed layer 116 is formed over the release layer 104. In some embodiments, the seed layer 116 is a metal layer, which may be a single layer or a composite layer comprising a plurality of sub-layers formed of different materials. In a particular embodiment, the seed layer 116 comprises a titanium layer and a copper layer over the titanium layer. The seed layer 116 may be formed using, for example, PVD or the like. A photoresist is formed and patterned on the seed layer 116. The photoresist may be formed by spin coating or the like and may be exposed to light for patterning. The pattern of the photoresist corresponds to the conductive vias 120. The patterning forms openings through the photoresist to expose the seed layer 116. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer 116 on which the conductive material is not formed are removed. The photoresist may be removed by an acceptable ashing or stripping process, such as using an oxygen plasma or the like. Once the photoresist is removed, exposed portions of the seed layer 116 are removed, such as by using an acceptable etching process, such as by wet or dry etching. The remaining portions of the seed layer 116 and conductive material form the conductive vias 120. In an embodiment, a first grouping of conductive vias 120 that are adjacent to each other form a first plurality of vias 120A, and a second grouping of conductive vias 120 that are adjacent to each other form a second plurality of vias 120B, wherein the first plurality of vias 120A is disposed over a different region of the carrier substrate 102 than the second plurality of vias 120B.

Figure 4:
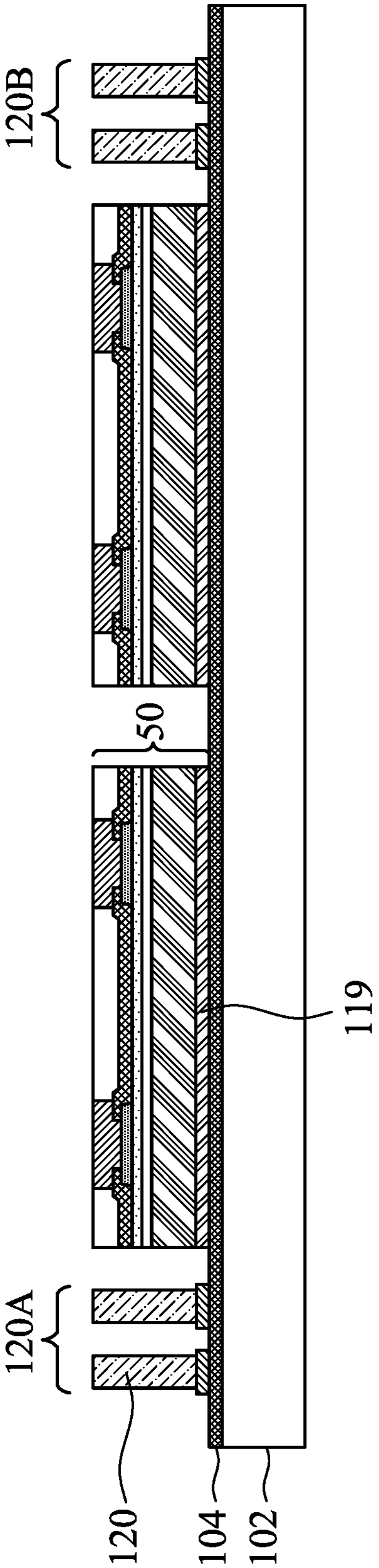

In FIG. 4, one or more of the integrated circuit dies 50 are adhered to the release layer 104 by an adhesive 119. The integrated circuit dies 50 maybe adhered to the release layer 104 using for example, a pick and place process, or the like. Although two integrated circuit dies 50 are shown adhered to the release layer 104 in FIG. 4, any desired type and quantity of integrated circuit dies 50 can be adhered to the release layer 104. In the embodiment shown, two integrated circuit dies 50 are adhered adjacent one another, and in between the first plurality of vias 120A and the second plurality of vias 120B. Each of the integrated circuit dies 50 may be a logic device, such as a central processing unit (CPU), a graphics processing unit (GPU), a system-on-a-chip (SoC), a microcontroller, a memory device, such as a dynamic random access memory (DRAM) die, a static random access memory (SRAM) die, a hybrid memory cube (HMC) module, a high bandwidth memory (HBM) module, or the like. In some embodiments, all the integrated circuit dies 50 may be the same type of dies, such as SoC dies. Each of the integrated circuit dies 50 may be formed in processes of a same technology node as the other integrated circuit dies 50. In other embodiments, each of the integrated circuit dies 50 may be formed in processes of different technology nodes. Each of the integrated circuit dies 50 may have a different size (e.g., different height and/or surface area) from the other integrated circuit dies 50, or may have the same size (e.g., same heights and/or surface areas).

The adhesive 119 is on back-sides of the integrated circuit dies 50 and adheres the integrated circuit dies 50 to the release layer 104. The adhesive 119 may be any suitable adhesive, epoxy, die attach film (DAF), or the like. The adhesive 119 may be applied to back-sides of the integrated circuit dies 50, or may be applied over the surface of the release layer 104. For example, the adhesive 119 may be applied to the back-sides of the integrated circuit dies 50 before singulating to separate the integrated circuit dies 50.

Figure 5:
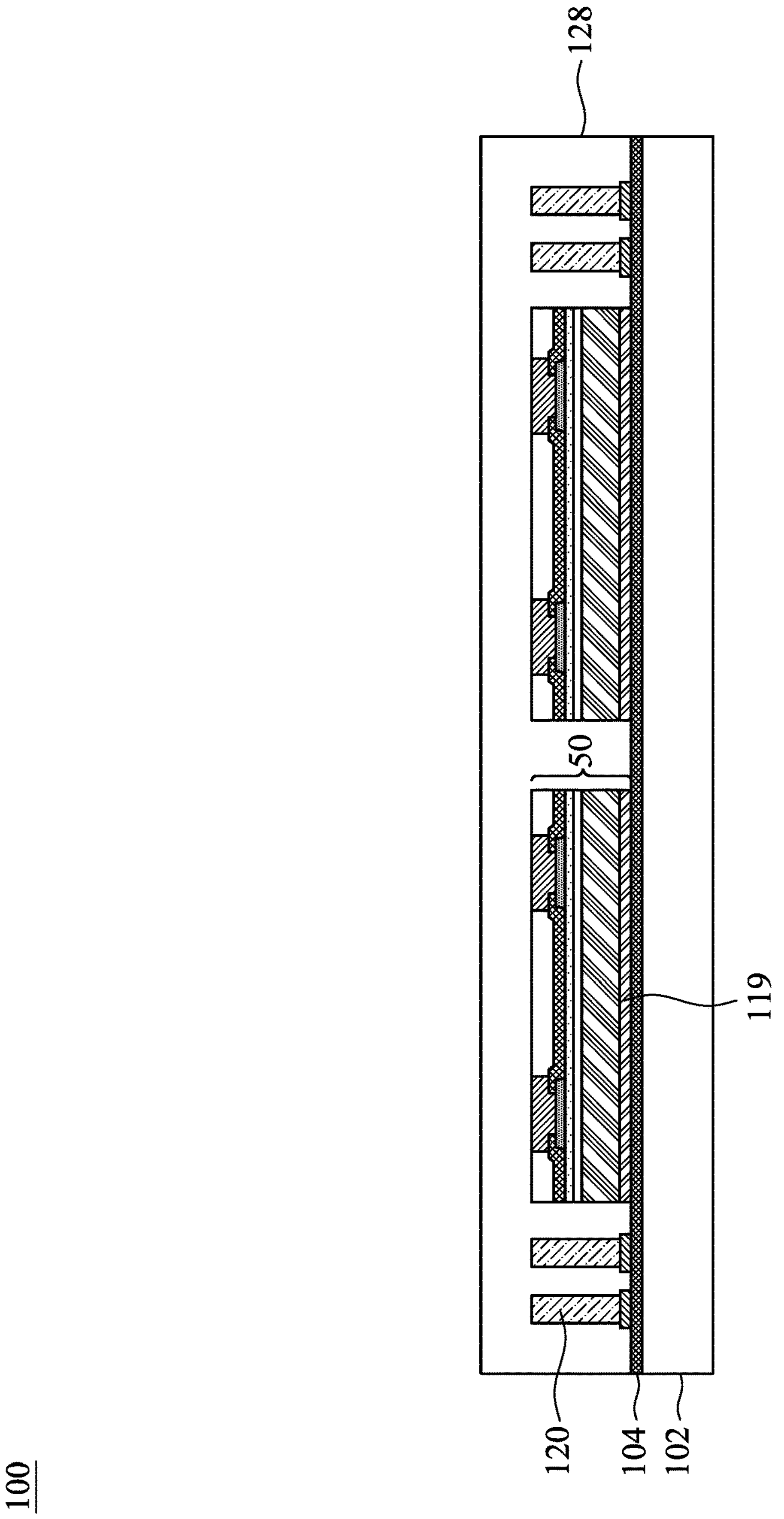

In FIG. 5, an electrically insulating molding material (or molding compound) 128 is formed over the structure shown in FIG. 4, such as on top surfaces and sidewalls of the conductive vias 120, top surfaces and sidewalls of the integrated circuit dies 50, sidewalls of the adhesive 119, and top surfaces of the release layer 104. The molding material 128 fills spaces between each of the conductive vias 120; spaces between adjacent integrated circuit dies 50; as well as spaces between each integrated circuit die 50 and a nearest conductive via 120. The molding material 128 can include a dielectric material, such as silicon-based material, an epoxy molding compound that includes silica, or the like, that provides electrical isolation between each of the conductive vias 120 and other structures of the first package component 100. The molding material 128 can be formed according to various formation techniques, such as a spin-on process, a deposition process, an injection process, or the like.

Figure 6:
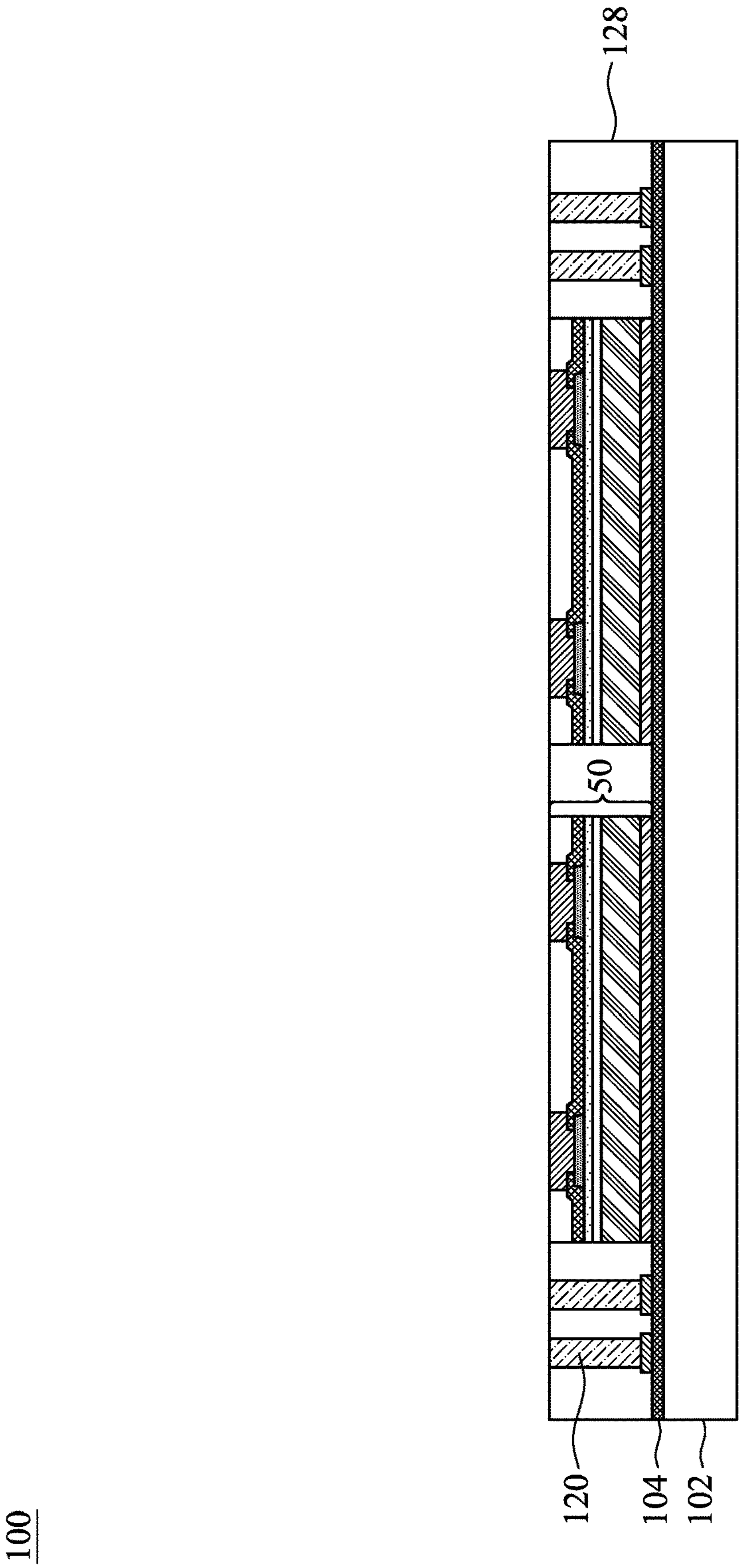

In FIG. 6, excess portions of the molding material 128 may be planarized by grinding, CMP, or the like, to remove a portion of the molding material 128 and expose top surfaces of the conductive vias 120. During the planarization, a portion of the dielectric layer 68 of each of the plurality of integrated circuit dies 50 may also be removed so as to expose top surfaces of the die connectors 66. As illustrated in FIG. 6, the planarization may result in the top surfaces of the conductive vias 120 and the die connectors 66 being level with a top surface of the molding material 128. Each conductive via 120 is electrically connected to a front-side redistribution structure 122 (shown subsequently in FIG. 8).

Figure 7:
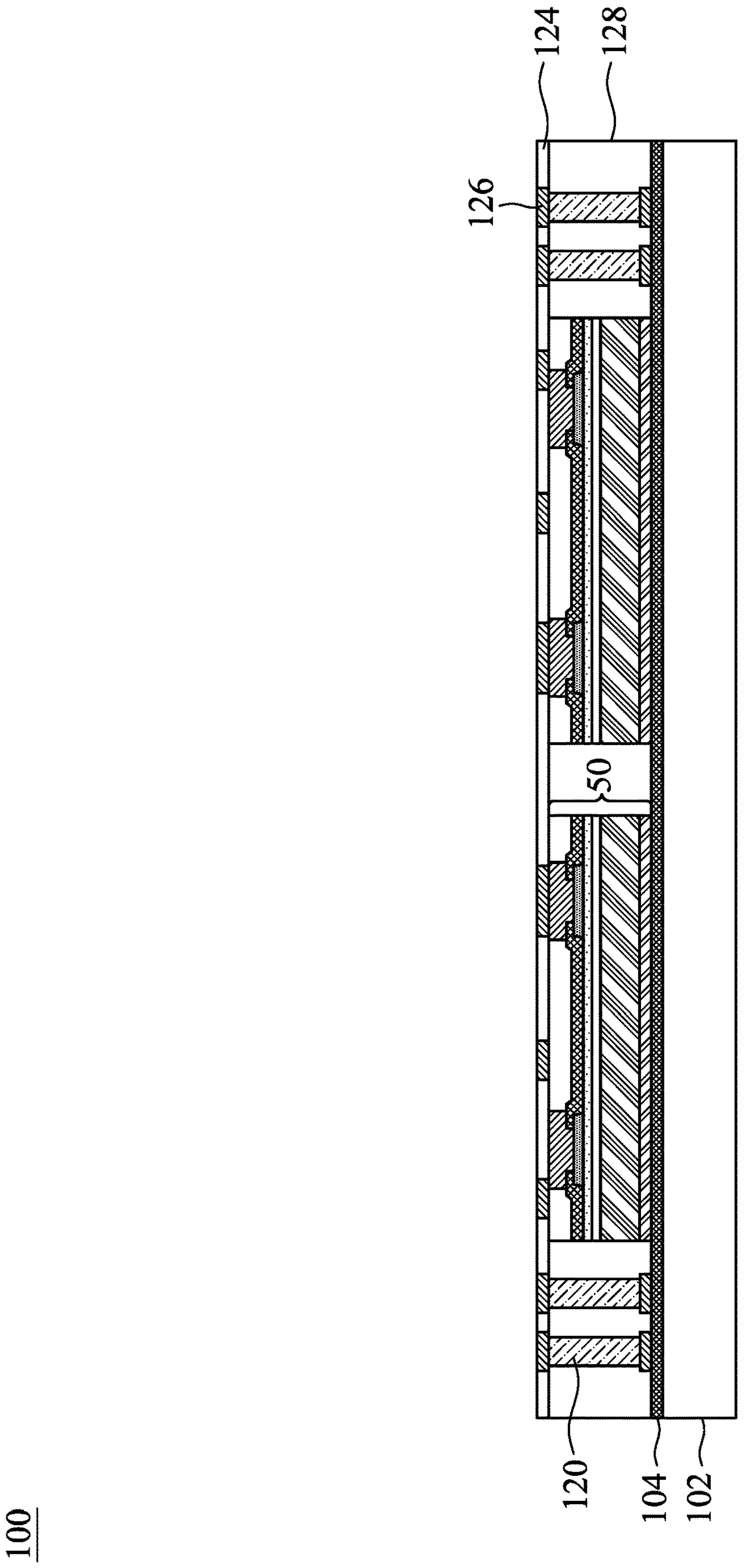

In FIG. 7, conductive pads 126 (which may also be referred to as a metallization pattern) are formed over the integrated circuit dies 50, the conductive vias 120, and the molding material 128. The conductive pads 126 are part of the front-side redistribution structure 122 (shown subsequently in FIG. 8). The conductive pads 126 may be in physical contact and electrically connected to the conductive vias 120 and the die connectors 66 of each of the integrated circuit dies 50. To form the conductive pads 126, a seed layer is first formed on top surfaces of the integrated circuit dies 50, the conductive vias 120, and the molding material 128. The metal seed layer may comprise, for example, a titanium and copper bilayer (e.g., a layer of copper on a layer of titanium), a singular copper layer, or other suitable metal layer, and may be deposited using a PVD process (e.g., sputtering) or the like. Any suitable thickness may be used for the seed layer. A conductive material layer is then deposited on the seed layer. The conductive material layer may be copper, or the like, that is deposited using a plating process, for example, electroplating, electroless plating, immersion plating, or the like. The seed layer and the conductive material layer may be then be patterned using acceptable photolithography and etching techniques to remove portions of the seed layer and conductive material layer. The remaining portions of the seed layer and overlying conductive material layer form the conductive pads 126.

Referring further to FIG. 7, a dielectric layer 124 is formed over the conductive pads 126. The dielectric layer 124 is formed such that the conductive pads 126 are embedded in the dielectric layer 124. The dielectric layer 124 may be, for example, a layer of polymer material such as, e.g., a low-temperature polyimide (PI), polybenzoxazole (PBO), benzocyclobutene (BCB), or other polymer material that is electrically insulating. The dielectric layer 124 may be formed using a process such as lamination, coating, (e.g., spin-coating), chemical vapor deposition (CVD), or the like. In an embodiment, the dielectric layer 124 is formed using a coating process, after which a curing process is performed on the dielectric layer 124. After the formation of the dielectric layer 124, a planarization step, such as a chemical mechanical polish (CMP), may be performed to remove excess portions of the dielectric layer 124, and to expose top surfaces of the conductive pads 126. Accordingly, top surfaces of the dielectric layer 124 are level with top surfaces of the conductive pads 126.

Figure 8:
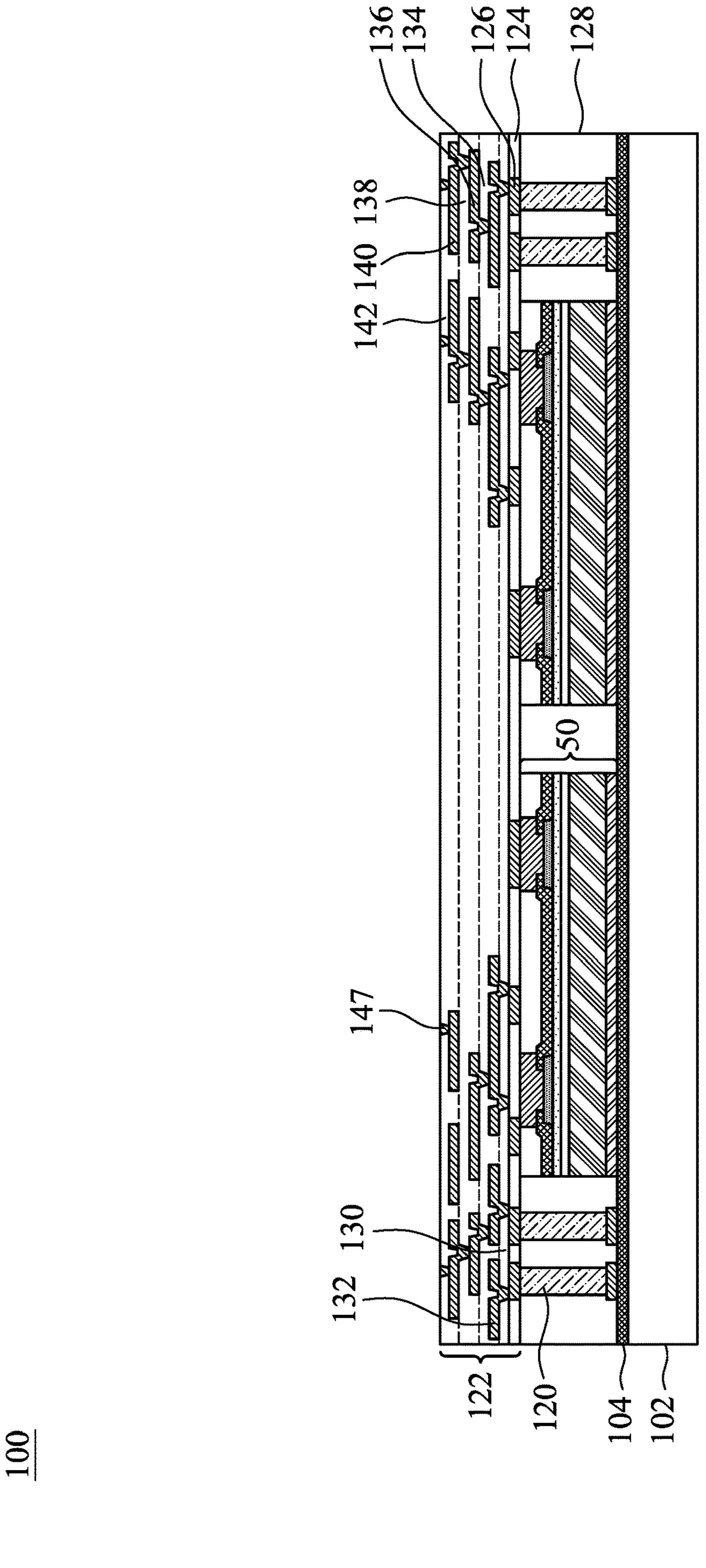

In FIG. 8, the remainder of the front-side redistribution structure 122 is formed over the molding material 128, the conductive vias 120, and the integrated circuit dies 50. The front-side redistribution structure 122 includes dielectric layers 124, 130, 134, 138, and 142; and metallization patterns 132, 136, 140, and 147. The metallization patterns may also be referred to as redistribution layers or redistribution lines. More or fewer dielectric layers and metallization patterns may be formed in the front-side redistribution structure 122 than are shown in FIG. 8. If fewer dielectric layers and metallization patterns are to be formed, steps and process discussed below may be omitted. If more dielectric layers and metallization patterns are to be formed, steps and processes discussed below may be repeated.

Referring further to FIG. 8, the dielectric layer 130 is deposited on the dielectric layer 124 and the conductive pads 126. The dielectric layer 130 may be, for example, a layer of polymer material such as, e.g., a low-temperature polyimide (PI), polybenzoxazole (PBO), benzocyclobutene (BCB), or other polymer material that is electrically insulating. The dielectric layer 130 may be formed using a process such as lamination, coating, (e.g., spin-coating), chemical vapor deposition (CVD), or the like. The dielectric layer 130 is then patterned. The patterning forms openings exposing portions of the conductive pads 126. The patterning may be by an acceptable process, such as by etching using, for example, an anisotropic etch.

The metallization pattern 132 is then formed. The metallization pattern 132 includes conductive elements extending along the major surface of the dielectric layer 130 and extending through the dielectric layer 130 to physically and electrically couple to the conductive pads 126, the conductive vias 120, and the integrated circuit dies 50. As an example to form the metallization pattern 132, a seed layer is formed over the dielectric layer 130 and in the openings extending through the dielectric layer 130. In some embodiments, the seed layer is a metal layer, which may be a single layer or a composite layer comprising a plurality of sublayers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 132. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 132. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by u sing an acceptable etching process, such as by wet or dry etching.

After the formation of the metallization pattern 132, the dielectric layer 134 is deposited on the metallization pattern 132 and the dielectric layer 130. The dielectric layer 134 may be formed in a manner similar to the dielectric layer 130, and may be formed of a similar material as the dielectric layer 130.

The metallization pattern 136 is then formed. The metallization pattern 136 includes portions on and extending along the major surface of the dielectric layer 134. The metallization pattern 136 further includes portions extending through the dielectric layer 134 to physically and electrically couple the metallization pattern 132. The metallization pattern 136 may be formed in a similar manner and of a similar material as the metallization pattern 132. In some embodiments, the metallization pattern 136 has a different size than the metallization pattern 132. For example, the conductive lines and/or vias of the metallization pattern 136 may be wider or thicker than the conductive lines and/or vias of the metallization pattern 132. Further, the metallization pattern 136 may be formed to a greater pitch than the metallization pattern 132.

After the formation of the metallization pattern 136, the dielectric layer 138 is deposited on the metallization pattern 136 and the dielectric layer 134. The dielectric layer 138 may be formed in a manner similar to the dielectric layer 130 and the dielectric layer 134, and may be formed of similar materials as the dielectric layer 130 and the dielectric layer 134.

The metallization pattern 140 is then formed. The metallization pattern 140 includes portions on and extending along the major surface of the dielectric layer 138. The metallization pattern 140 further includes portions extending through the dielectric layer 138 to physically and electrically couple the metallization pattern 136. The metallization pattern 140 may be formed in a similar manner and of a similar material as the metallization patterns 132 and 136.

After the formation of the metallization pattern 140, the dielectric layer 142 is deposited on the metallization pattern 140 and the dielectric layer 138. The dielectric layer 142 may be formed in a manner similar to the dielectric layer 138, and may be formed of the same material as the dielectric layer 138. The dielectric layer 142 is the topmost dielectric layer of the front-side redistribution structure 122.

The metallization pattern 147 is then formed. The metallization pattern 147 includes portions extending through the dielectric layer 142 to physically and electrically couple the metallization pattern 140. The metallization pattern 147 may be formed in a similar manner and of a similar material as the metallization patterns 132, 136, and 140. The metallization pattern 147 is the topmost metallization pattern of the front-side redistribution structure 122. As such, all of the intermediate metallization patterns of the front-side redistribution structure 122 (e.g., the metallization patterns 132, 136, and 140) are disposed between the metallization pattern 147 and the integrated circuit dies 50. In some embodiments, the metallization pattern 147 has a different size than the metallization patterns 132, 136, and 140. For example, the conductive lines and/or vias of the metallization pattern 147 may be wider or thicker than the conductive lines and/or vias of the metallization patterns 132, 136, and 140. Further, the metallization pattern 147 may be formed to a greater pitch than the metallization pattern 140.

The front-side redistribution structure 122 is formed such that a center region of the front-side redistribution structure 122 does not have any metallization patterns. The center region of the front-side redistribution structure 122 is over a first conductive pad 126 that overlaps and is electrically connected to a die connector 66 of a first one of the integrated circuit dies 50. The center region of the front-side redistribution structure 122 is also over a second conductive pad 126 that overlaps and is electrically connected to a die connector 66 of a second one of the integrated circuit dies 50. The first one of the integrated circuit dies 50 is adjacent to the second one of the integrated circuit dies 50.

Figure 9:
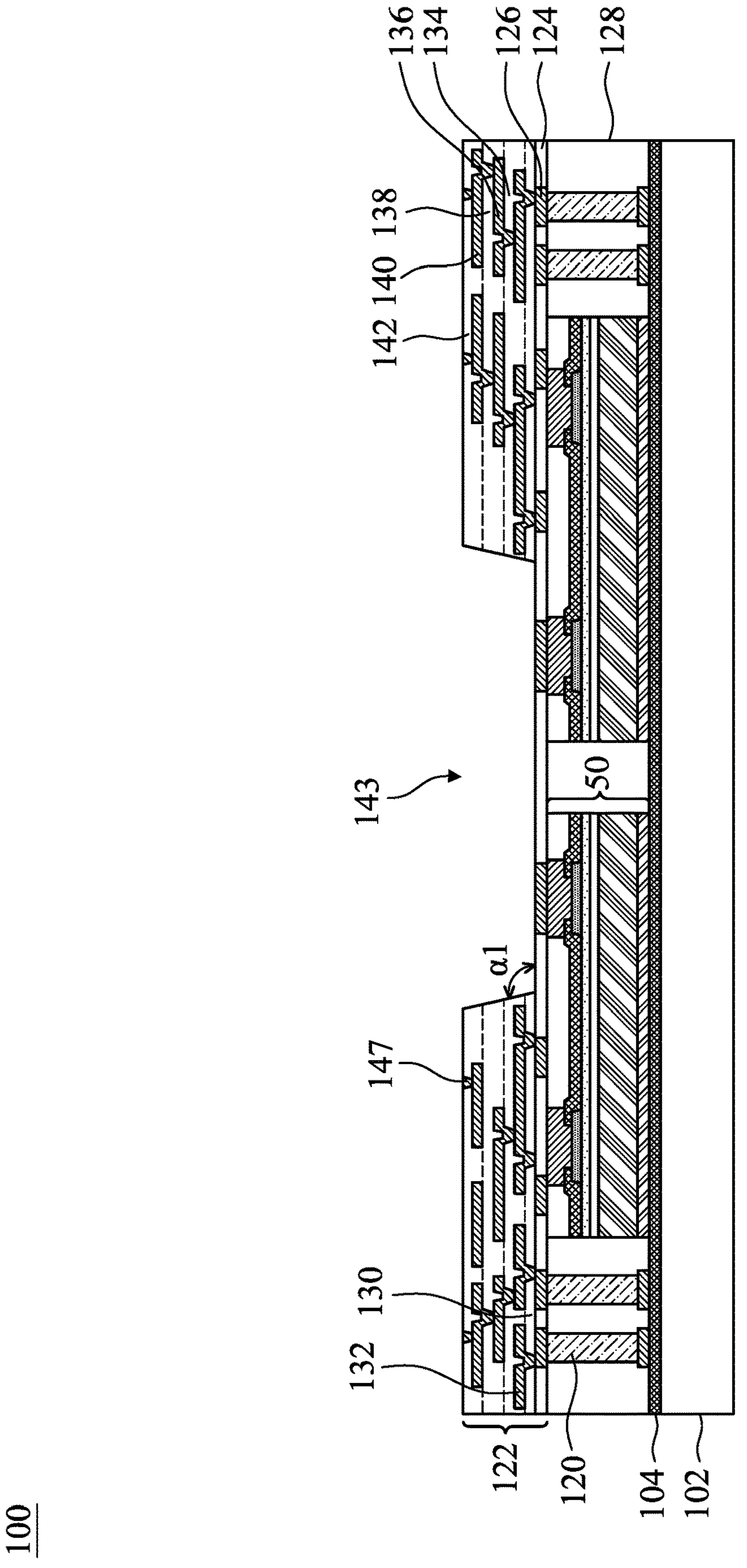

In FIG. 9, a mask layer (e.g., a photoresist) may be formed over the front-side redistribution structure 122 and subsequently patterned to expose a top surface of the front-side redistribution structure 122. The mask layer may expose the center region of the front-side redistribution structure 122 that does not have any metallization patterns. A suitable etching process is then performed using the mask layer as an etching mask to form an opening 143 in the front-side redistribution structure 122. The etching process may be a dry or wet etching process. The opening 143 exposes top surfaces of portions of the dielectric layer 124. In addition, the opening 143 exposes a top surface of a first conductive pad 126 that overlaps and is electrically connected to a die connector 66 of a first one of the integrated circuit dies 50.

The opening 143 also exposes a top surface of a second conductive pad 126 that overlaps and is electrically connected to a die connector 66 of a second one of the integrated circuit dies 50. The first one of the integrated circuit dies 50 is adjacent to the second one of the integrated circuit dies 50. After the formation of the opening 143, sidewalls of the opening 143 may form an angle α1 with a top surface of the dielectric layer 124, wherein the angle α1 is in a range from 80° to 89°.

Figure 10:
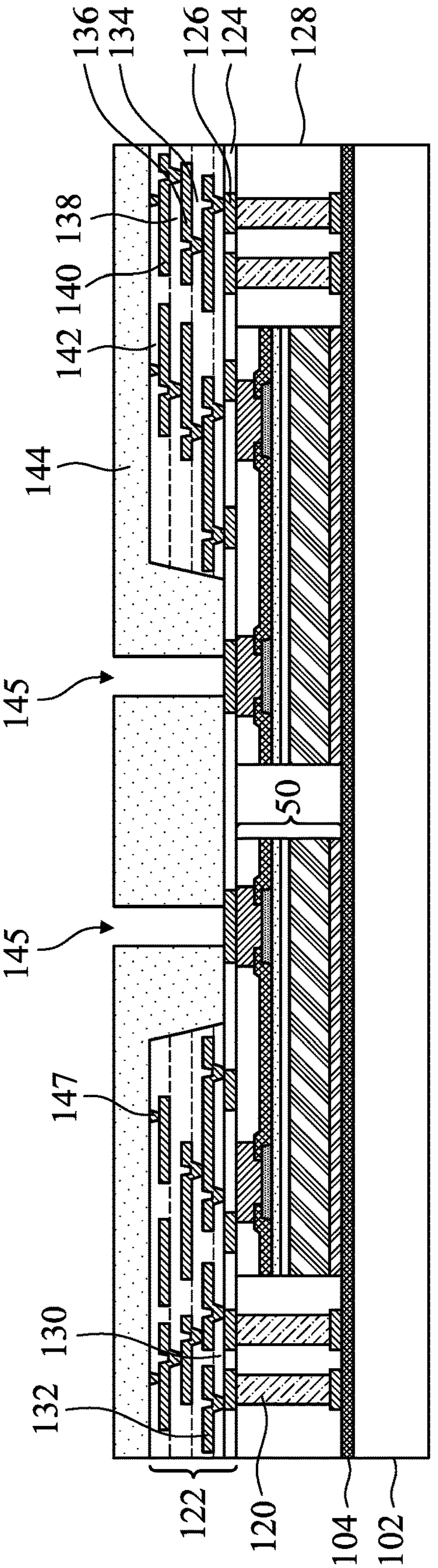

In FIG. 10, a mask layer 144 is formed over the structure shown in FIG. 9, such as over the front-side redistribution structure 122 and in the opening 143. The mask layer 144 may be a photoresist, or the like, and may be formed using a spin coating or deposition process. The mask layer 144 may be patterned using acceptable development and exposure techniques to form openings (or through holes) 145 in which electrically conductive vias 146 (shown subsequently in FIG. 11) are formed. The openings 145 may expose top surfaces of the first conductive pad 126 and the second conductive pad 126.

Figure 11:
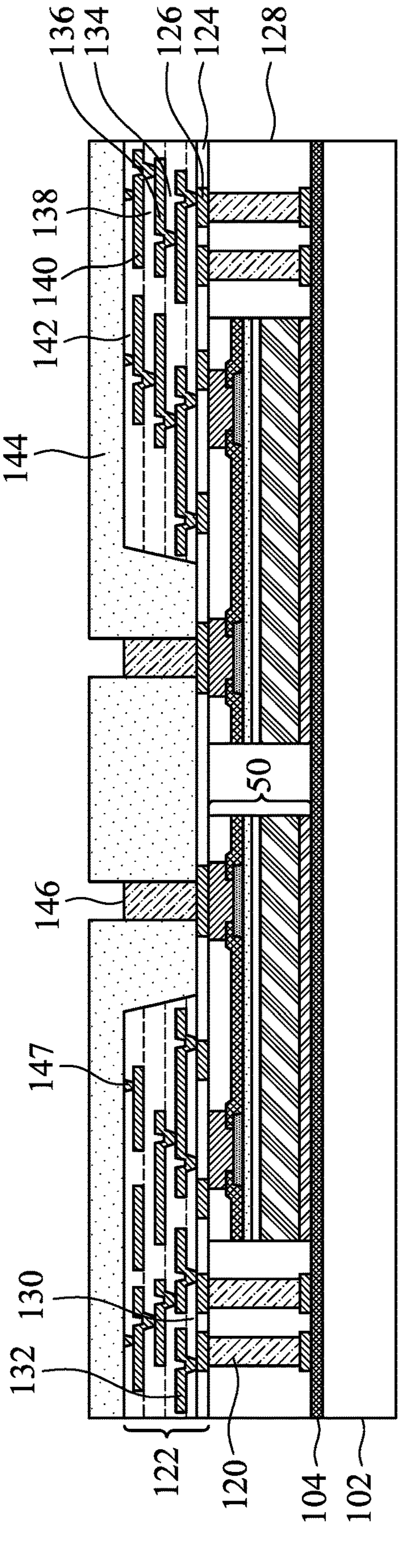

In FIG. 11, a conductive material is formed on exposed top surfaces of each of the first conductive pad 126 and the second conductive pad 126 in order to at least partially fill in the openings 145 and form the conductive vias 146. The conductive material may be a copper layer or other suitable metal formed by an electrochemical plating (ECP) process, or the like. During the ECP process, the conductive material is deposited vertically on bottom surfaces of the openings 145 such that the conductive vias 146 fill in bottom portions of the openings 145. In this way, top surfaces of the mask layer 144 are higher than top surfaces of the conductive vias 146.

Figure 12:
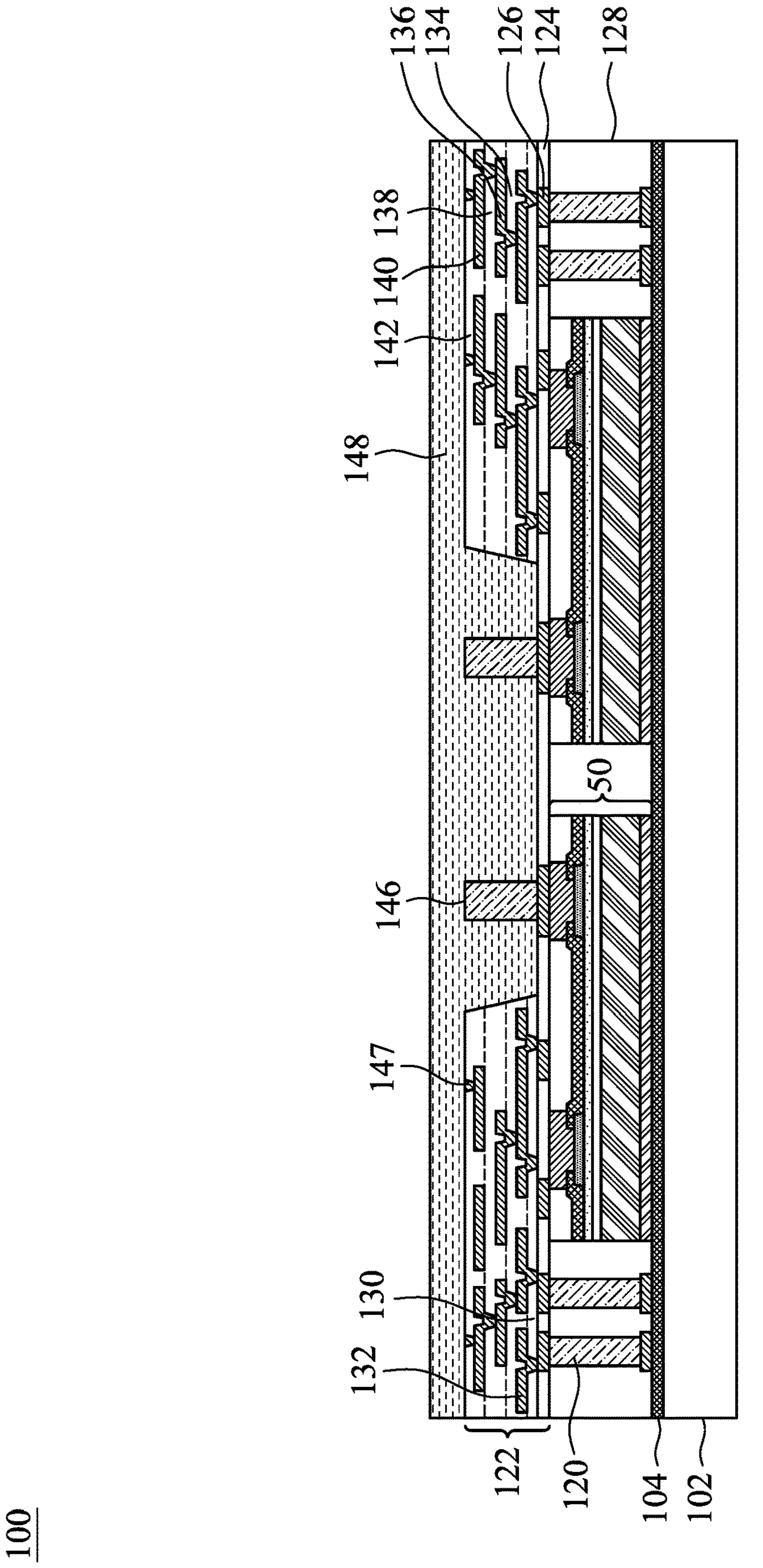

In FIG. 12, the mask layer 144 may be removed using a suitable removal process such as ashing (e.g., an ozone plasma ashing process) or chemical stripping (e.g., a wet acid clean process). An electrically insulating molding material (or molding compound) 148 is formed on top surfaces and sidewalls of the conductive vias 146, and on top surfaces and sidewalls of the front-side redistribution structure 122. The molding material 148 fills spaces between adjacent conductive vias 146, as well as spaces between each conductive via 146 and an adjacent sidewall of the front-side redistribution structure 122. The molding material 148 can be formed according to various formation techniques, such as a spin-on process, a deposition process, an injection process, a compression molding process, or the like. A top surface of the molding material 148 is higher than the top surfaces of the conductive vias 146 and topmost surfaces of the front-side redistribution structure 122. The molding material 148 can include a dielectric material, such as silicon-based material, an epoxy molding compound that includes silica filler, or the like, that provides electrical isolation between each of the conductive vias 146 and other structures of the first package component 100. In an embodiment, the molding material 148 may have a silica filler content that is less than 70 percent by weight. In an embodiment, the molding material 148 may have a silica filler content by weight that is different than a silica filler content by weight of the molding material 128. Advantageous features may be achieved by the molding material 148 having a silica filler content that is less than 70 percent by weight. These advantages include the molding material 148 having a dielectric constant (k) that is in a range from 2.8 to 4.2, which allows for enhanced electrical performance of the first package component 100. Further, the molding material 148 formed around each conductive via 146 provides high stiffness, and this prevents cracking in the molding material 148. This results in an improved reliability of the integrated circuit package.

Figure 13:
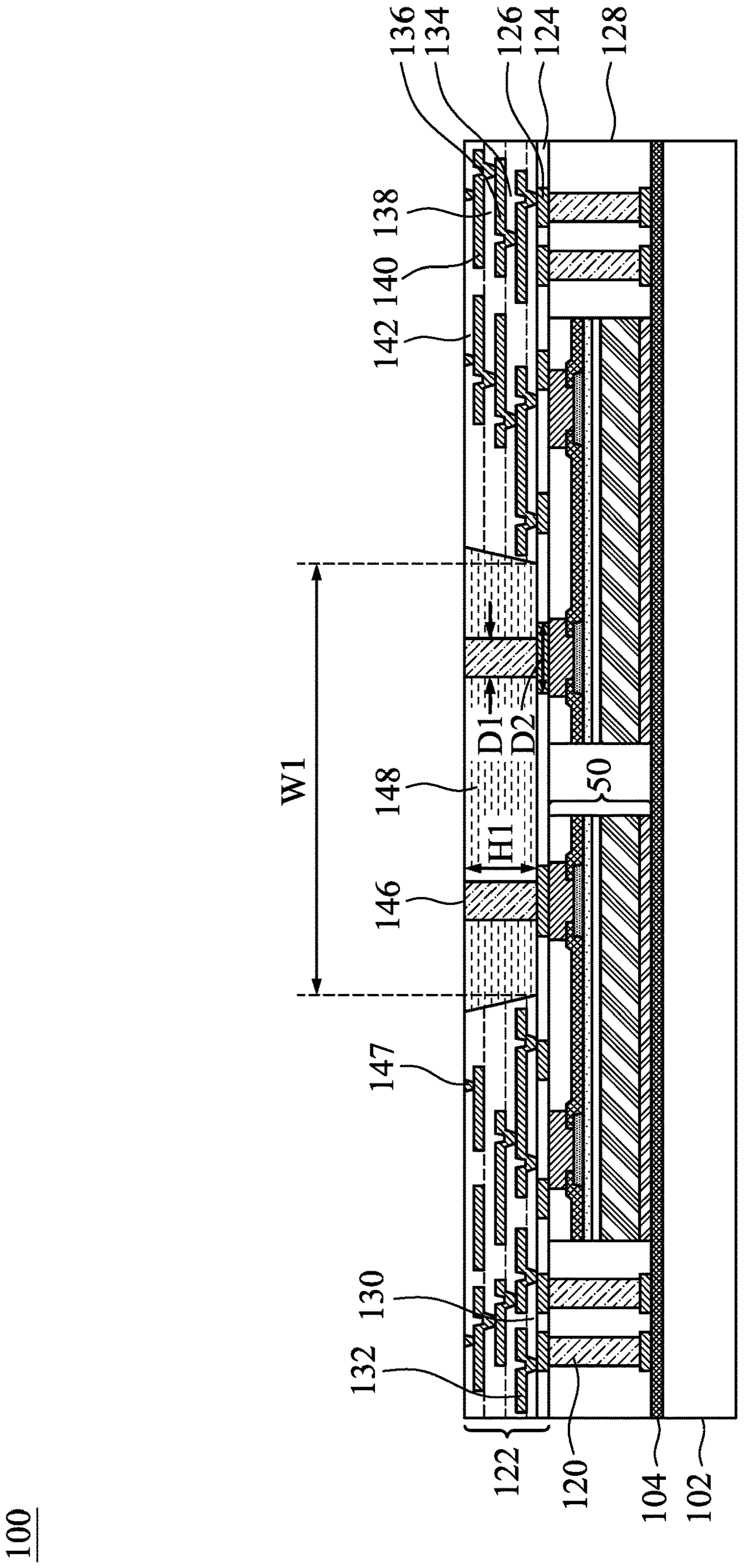

In FIG. 13, excess portions of the molding material 148 and the conductive vias 146 may be planarized by grinding, CMP, or the like, to remove portions of the molding material 148 and portions of the conductive vias 146. After the planarization, top surfaces of the vias 146 are exposed, and are level with top surfaces of the molding material 148 and the front-side redistribution structure 122. Each conductive via 146 is electrically connected to a die connector 66 of an integrated circuit die 50. The molding material 148 provides electrical isolation between each of the conductive vias 146 and other structures of the first package component 100. In an embodiment, each conductive via 146 may have an aspect ratio (ratio of a height H1 of the conductive via 146 to a diameter D1 of the via 146) that is equal to or less than 10. In an embodiment, each of the first conductive pad 126 and the second conductive pad 126 have a diameter D2, wherein each of the first conductive pad 126 and the second conductive pad 126 are electrically and physically connected to a conductive via 146. In an embodiment, a ratio of the diameter D1 to the diameter D2 is equal to or less than 1. Advantageous features may be achieved by having the ratio of the diameter D1 to the diameter D2 equal to 1, as well as each conductive via 146 having an aspect ratio (ratio of the height H1 of the conductive via 146 to the diameter D1 of the conductive via 146) that is less than 10. These advantages include a reduction in electrical resistance and an enhancement in electrical performance.

Figure 14:
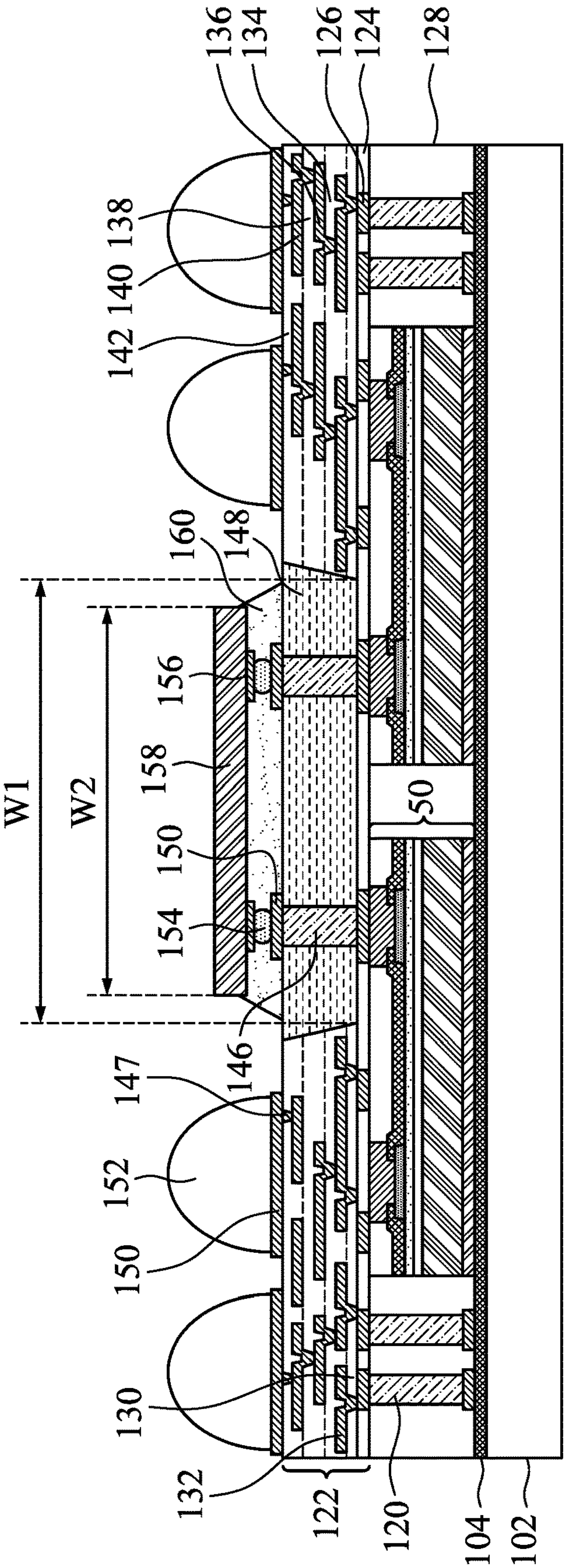

In FIG. 14, conductive pads 150 are formed over the front-side redistribution structure 122, the conductive vias 146, and the molding material 148. First ones of the conductive pads 150 may be in physical contact and electrically connected to the conductive vias 146. In this way, the first ones of the conductive pads 150 are also electrically connected to the die connectors 66 of each of the integrated circuit dies 50. In addition, second ones of the conductive pads 150 may be in physical and electrical contact with the front-side redistribution structure 122 through the metallization pattern 147. To form the conductive pads 150, a seed layer is first formed on top surfaces of the front-side redistribution structure 122, the conductive vias 146, and the molding material 148. The metal seed layer may comprise, for example, a titanium and copper bilayer (e.g., a layer of copper on a layer of titanium), a singular copper layer, or other suitable metal layer, and may be deposited using a PVD process (e.g., sputtering) or the like. Any suitable thickness may be used for the seed layer. A conductive material layer is then deposited on the seed layer. The conductive material layer may be copper, or the like, that is deposited using a plating process, for example, electroplating, electroless plating, immersion plating, or the like. The seed layer and the conductive material layer may be then be patterned using acceptable photolithography and etching techniques to remove portions of the seed layer and conductive material layer. The remaining portions of the seed layer and overlying conductive material layer form the conductive pads 150.

After the formation of the conductive pads 150, conductive connectors 154 are formed on the first ones of the conductive pads 150. The conductive connectors 154 may be solder balls, metal pillars, micro bumps, or the like. The conductive connectors 154 may include a conductive material such as solder, copper, aluminum, gold, nickel, silver, palladium, tin, the like, or a combination thereof. In some embodiments, the conductive connectors 154 are formed by initially forming a layer of solder through evaporation, electroplating, printing, solder transfer, or the like. Once a layer of solder has been formed on the structure, a reflow may be performed in order to shape the material into the desired bump shapes. In another embodiment, the conductive connectors 154 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

After the formation of the conductive connectors 154, a silicon bridge 158 (sometimes referred to as a local silicon interconnect (LSI)) is coupled to the first ones of the conductive pads 150. The silicon bridge 158 functions to provide electrical communication between two adjacent integrated circuit dies 50. In some embodiments, the silicon bridge 158 includes one or more interconnect layers (not shown in FIG. 14) on a semiconductor substrate (e.g., a silicon substrate). In addition, the silicon bridge 158 may comprise conductive pads 156 formed on a top surface of the silicon bridge 158, wherein the conductive pads 156 are electrically connected to the interconnect layers. The interconnect layers provide electrical communication between the two adjacent integrated circuit dies 50. The interconnect layers may include metal lines formed of a metal, such as copper, aluminum, tungsten, or titanium distributed in a plurality of layers, and vias interconnecting the metal lines of different layers. The one or more interconnect layers may be formed using methods for forming interconnect lines in integrated circuits. In some embodiments, the silicon bridge 158 may be free from active devices (such as transistors) and passive devices (such as inductors, resistors, and capacitors). In alternative embodiments, the silicon bridge 158 includes passive devices, but does not include active devices. In yet alternative embodiments, the silicon bridge 158 includes both active devices and passive devices therein.

To couple the conductive connectors 154 to the silicon bridge 158, the conductive connectors 154 are reflowed. The conductive connectors 154 electrically and/or physically couple the silicon bridge 158 to the first package component 100. In some embodiments, an underfill 160 may be formed between the first package component 100 and the silicon bridge 158 and surrounding the conductive connectors 154. The underfill 160 may be formed by a capillary flow process after the silicon bridge 158 is attached or may be formed by a suitable deposition method before the silicon bridge 158 is attached. In an embodiment, a smallest width of the molding material 148 from a first outermost sidewall of the molding material 148 to a second outermost sidewall of the molding material 148 is equal to a width W1. In an embodiment, a width of the silicon bridge 158 in a direction that is parallel to a top surface of the molding material 148 is equal to a width W2, wherein the width W2 is smaller or equal to the width W1. In such embodiments, the molding material 148 may be wider than the silicon bridge 158 even at the narrowest point of the molding material 148. Advantageous features may be achieved by having the width W2 of the silicon bridge 158 in a direction that is parallel to a top surface of the molding material 148 being equal to or smaller than the width W1 of the molding material 148. These advantages include having an adequate amount of molding material 148 to surround and support the conductive vias 146. This results in an improved reliability of the integrated circuit package.

After the coupling of the first package component 100 to the silicon bridge 158, conductive connectors 152 are formed on the second ones of the conductive pads 150. The conductive connectors 152 may be ball grid array (BGA) connectors, solder balls, or the like. The conductive connectors 152 may include a conductive material such as solder, copper, aluminum, gold, nickel, silver, palladium, tin, the like, or a combination thereof. In some embodiments, the conductive connectors 152 are formed by initially forming a layer of solder through evaporation, electroplating, printing, solder transfer, ball placement, or the like. Once a layer of solder has been formed on the structure, a reflow may be performed in order to shape the material into the desired bump shapes. The conductive connector 152 may be used to bond the first package component 100 to another package component, such as a package substrate, or the like.

Figure 15:
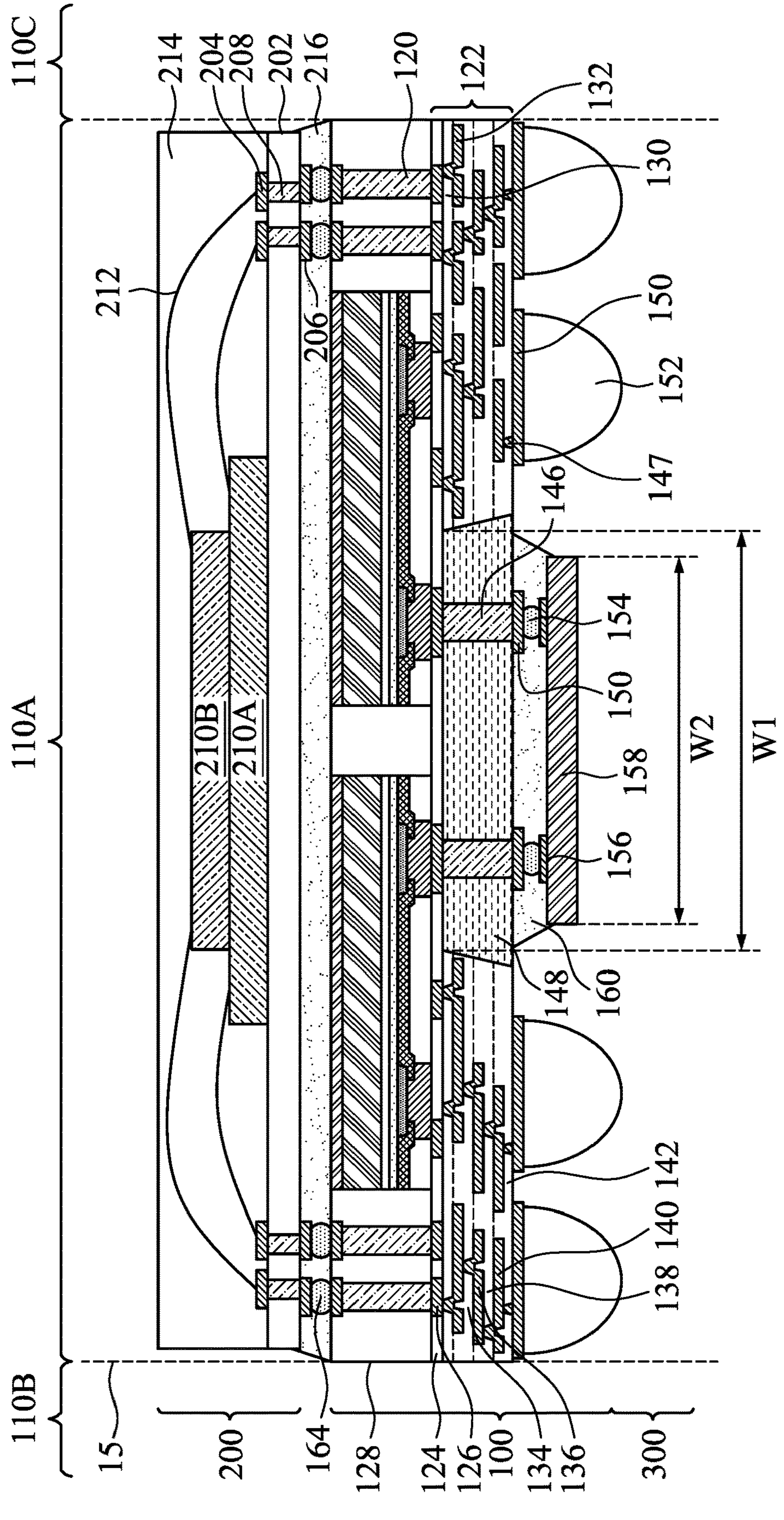

In FIG. 15, a carrier substrate de-bonding is performed to detach (or "de-bond") the carrier substrate 102 from the first package component 100, e.g., the integrated circuit dies 50, the conductive vias 120, and the molding material 128. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape (not shown).

After the de-bonding of the carrier substrate 102 from the first package component 100, conductive connectors 164 are formed on and in physical contact with top surfaces of the conductive vias 120. The conductive connectors 164 may be solder balls, or the like. The conductive connectors 164 may include a conductive material such as solder, or the like. In some embodiments, the conductive connectors 164 are formed by initially forming a layer of solder through evaporation, electroplating, printing, solder transfer, or the like. Once a layer of solder has been formed on the structure, a reflow may be performed in order to shape the material into the desired bump shapes.

Still referring to FIG. 15, a second package component 200 is coupled to the first package component 100 to form an integrated circuit device stack 110 (also referred to as a package 110). The second package component 200 includes, for example, a substrate 202 and one or more stacked dies 210 (e.g., 210A and 210B) coupled to the substrate 202. Although one set of stacked dies 210 (210A and 210B) is illustrated, in other embodiments, a plurality of stacked dies 210 (each having one or more stacked dies) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 202.

The substrate 202 may include active and passive devices (not shown). A wide variety of devices such as transistors, capacitors, resistors, combinations of these, and the like may be used to generate the structural and functional requirements of the design for the second package component 200. The devices may be formed using any suitable methods.

The substrate 202 may also include metallization layers (not shown) and the conductive vias 208. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210, and bond pads 206 on a second side of the substrate 202, the second side being opposite the first side of the substrate 202, to couple to the conductive connectors 152. In some embodiments, the bond pads 204 and 206 are formed by forming recesses (not shown) into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer (not shown) made of copper, titanium, nickel, gold, palladium, the like, or a combination thereof. The conductive material of the bond pads 204 and 206 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In some embodiments, the bond pads 204 and the bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application. In some embodiments, the conductive vias 208 extend through the substrate 202 and couple at least one of the bond pads 204 to at least one of the bond pads 206.

In the illustrated embodiment, the stacked dies 210 are coupled to the substrate 202 by wire bonds 212, although other connections may be used, such as conductive bumps. In an embodiment, the stacked dies 210 are stacked memory dies. For example, the stacked dies 210 may be memory dies such as low-power (LP) double data rate (DDR) memory modules, such as LPDDR1, LPDDR2, LPDDR3, LPDDR4, or the like memory modules. In other embodiments, the stacked dies 210 may be memory dies that include e.g., dynamic random-access memory (DRAM) dies or flash memory dies.

The stacked dies 210 and the wire bonds 212 may be encapsulated by a molding material 214. The molding material 214 may be molded on the stacked dies 210 and the wire bonds 212, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the stacked dies 210 and the wire bonds 212 are buried in the molding material 214, and after the curing of the molding material 214, a planarization step, such as a grinding, is performed to remove excess portions of the molding material 214 and provide a substantially planar surface for the second package components 200.

After the second package component 200 is formed, the second package component 200 is mechanically and electrically bonded to the first package component 100 by way of the conductive connectors 164, the bond pads 206, and the conductive vias 120. In some embodiments, the stacked dies 210 may be coupled to the integrated circuit dies 50 through the wire bonds 212, the bond pads 204 and 206, the conductive vias 208, the conductive connectors 164, the conductive vias 120, and the front-side redistribution structure 122.

An underfill 216 is formed between the first package component 100 and the second package component 200, surrounding the conductive connectors 164. The underfill may reduce stress and protect the joints resulting from the reflowing of the conductive connectors 164. The underfill may be formed by a capillary flow process after the second package component 200 is attached, or may be formed by a suitable deposition method before the second package component 200 is attached.

Figure 16:
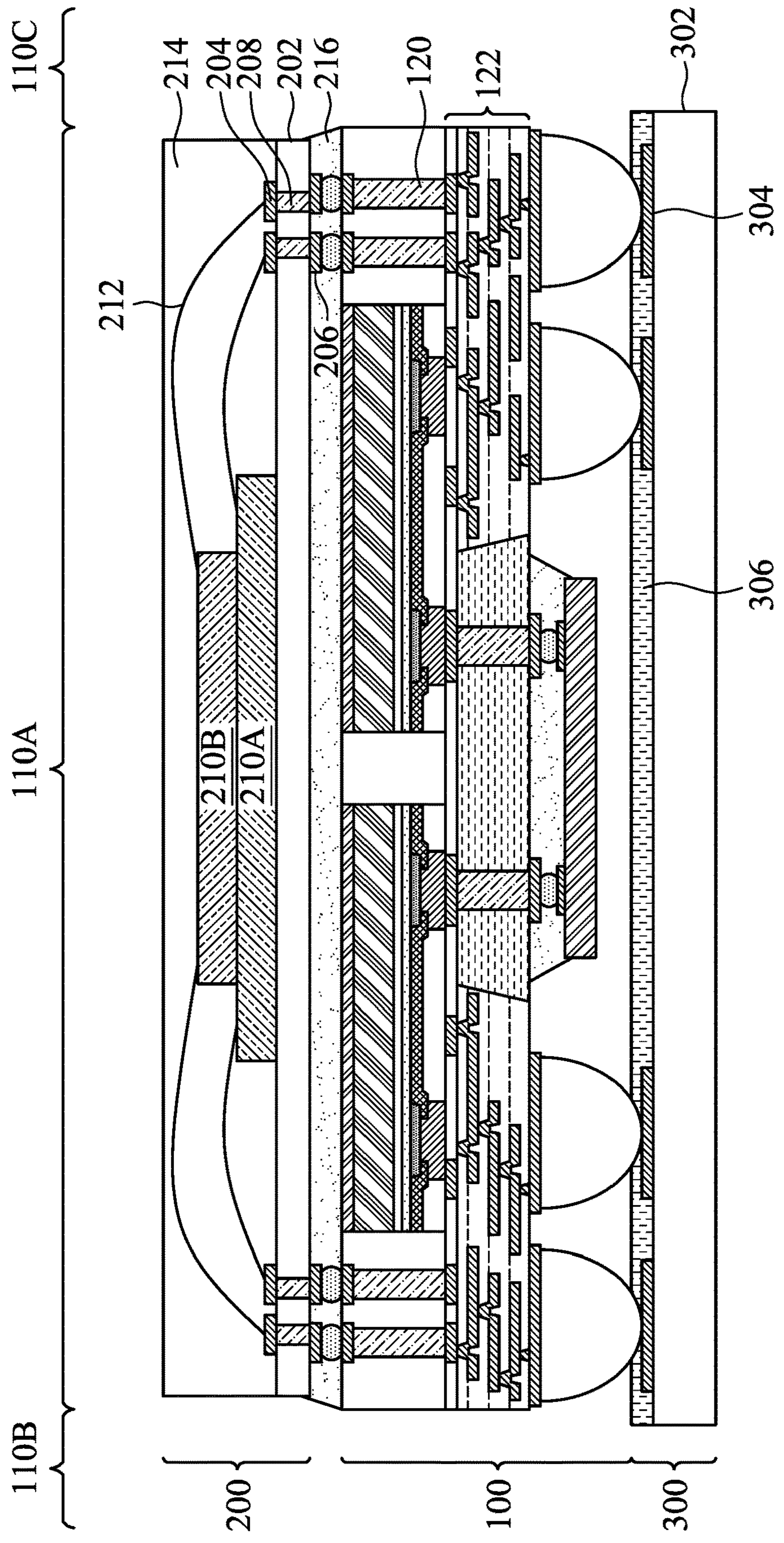

In FIG. 16, the package 110 is then placed on a tape, which may be fixed on a frame. In accordance with some embodiments, the package 110 is singulated in a sawing process performed by sawing along scribe line regions (e.g., scribe lines 15 shown in FIG. 15), and is separated into a plurality of packages (e.g., packages 110A-C) that have structures identical to each other. In some embodiments, the singulation process is performed after the second package components 200 are coupled to the first package component 100. In other embodiments (not shown), the singulation process is performed before the second package component 200 is coupled to the first package component 100.

Referring further to FIG. 16, each package 110 may then be mounted to a package substrate 300 using the conductive connectors 152. The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be an SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 152 are reflowed to attach the package 110 to the bond pads 304. The conductive connectors 152 electrically and/or physically couple the package substrate 300, including metallization layers in the substrate core 302, to the first package component 100. In some embodiments, a solder resist 306 is formed on the substrate core 302. The conductive connectors 152 may be disposed in openings in the solder resist 306 to be electrically and mechanically coupled to the bond pads 304. The solder resist 306 may be used to protect areas of the substrate 302 from external damage. Advantages can be achieved as a result of forming the first package component 100 that includes the front-side redistribution structure 122 over a first integrated circuit die 50 and a second integrated circuit die 50. A portion of the front-side redistribution structure 122 is removed to form the opening 143 in the front-side redistribution structure 122, and a first conductive via 146 and a second conductive via 146 are formed in the opening 143, wherein the first conductive via 146 is electrically connected to the first integrated circuit die 50 and the second conductive via 146 is electrically connected to the second integrated circuit die 50. The molding material 148 is formed around and between the first conductive via 146 and the second conductive via 146 to fill in the opening 143, and the silicon bridge 158 is coupled to the first conductive via 146 and the second conductive via 146. These advantages include allowing for a reduction in the length of the routing interconnect between the first integrated circuit die 50 and the second integrated circuit die 50. In addition, the first conductive via 146 and the second conductive via 146 can comprise larger diameters. These allow for a reduction in electrical resistance and an enhancement in electrical performance. Further, the molding material 148 formed around the first conductive via 146 and the second conductive via 146 provides high stiffness, and this prevents cracking in the molding material 148. This results in an improved reliability of the integrated circuit package.

Figure 17:
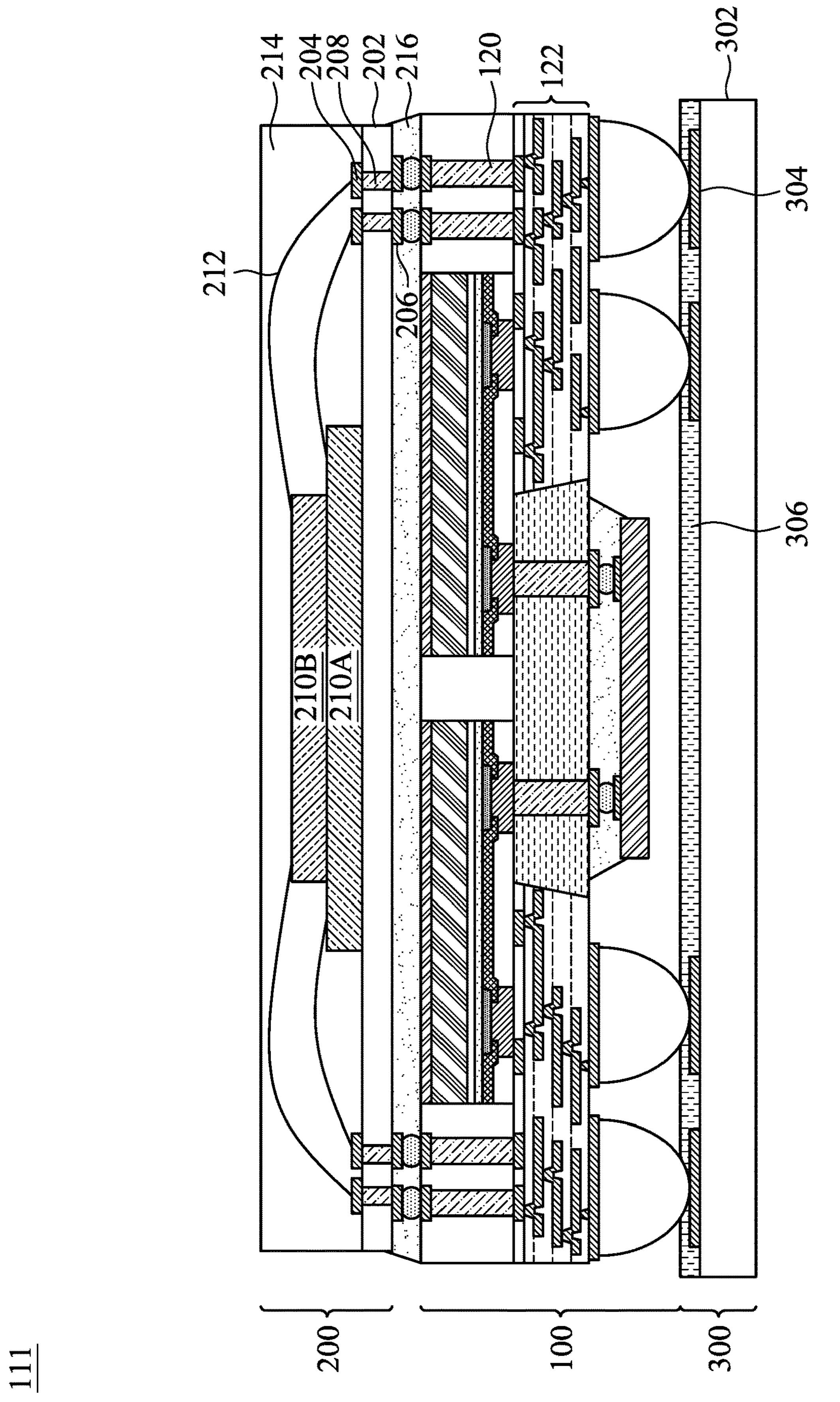
FIG. 17 illustrates cross-sectional views of intermediate steps during a process for forming a package in accordance with alternate embodiments.

FIG. 17 illustrates a package 111. Unless specified otherwise, like reference numerals in this embodiment (and subsequently discussed embodiments) represent like components in the embodiment shown in FIGS. 1 through 16 formed by like processes. Accordingly, the process steps and applicable materials may not be repeated herein.

The package 111 may be similar to the package 110 of FIG. 16. However, the package 111 may omit the conductive pads 126 and dielectric layer 124 disposed between the molding material 148 and the first integrated circuit die 50. In addition, there are no conductive pads 126 and dielectric layer 124 disposed between the molding material 148 and the second integrated circuit die 50. The molding material 148 is formed to extend completely through the front-side redistribution structure 122 such that the molding material 148 is in physical contact with the first integrated circuit die 50 and the second integrated circuit die 50. In addition, the first conductive via 146 and the second conductive via 146 are formed to extend completely through the molding material 148 to be in physical contact with a first die connector 66 of the first integrated circuit die 50 and a second die connector 66 of the second integrated circuit die 50, respectively. The first conductive via 146 and the second conductive via 146 are electrically coupled to the silicon bridge 158.

The embodiments of the present disclosure have some advantageous features. The embodiments are applied to forming an integrated circuit package that includes a front-side redistribution structure over a first integrated circuit die and a second integrated circuit die. A portion of the front-side redistribution structure is removed to form an opening in the front-side redistribution structure, and a first Through Insulator Via (TIV) and a second TIV are formed in the opening, wherein the first TIV is electrically connected to the first integrated circuit die and the second TIV is electrically connected to the second integrated circuit die. A molding material is formed around and between the first TIV and the second TIV to fill in the opening, and a silicon bridge is formed over and coupled to the first TIV and the second TIV. The advantageous features include allowing for a reduction in the length of the routing interconnect between the first integrated circuit die and the second integrated circuit die. In addition, the first TIV and second TIV can comprise larger diameters. These allow for a reduction in electrical resistance and an enhancement in electrical performance. Further, the molding material formed around the first TIV and the second TIV provides high stiffness, and this prevents cracking in the molding material. This results in an improved reliability of the integrated circuit package.

In accordance with an embodiment, a package includes a first die and a second die embedded in a first molding material; a first redistribution structure over the first die and the second die; a second molding material over portions of the first die and the second die, where the second molding material is disposed between a first portion of the first redistribution structure and a second portion of the first redistribution structure; a first via extending through the second molding material, where the first via is electrically connected to the first die; a second via extending through the second molding material, where the second via is electrically connected to the second die; and a silicon bridge electrically coupled to the first via and the second via. In an embodiment, the first via is in physical contact with a first die connector of the first die, and the second via is in physical contact with a second die connector of the second die. In an embodiment, the second molding material is in physical contact with the first die and the second die. In an embodiment, a third portion of the first redistribution structure is disposed between the second molding material and both the first die and the second die. In an embodiment, the first via is in physical contact with a first conductive pad in the third portion of the first redistribution structure, and the second via is in physical contact with a second conductive pad in the third portion of the first redistribution structure. In an embodiment, a silica filler content of the second molding material is less than 70 percent by weight.

In accordance with an embodiment, a package structure includes a first die and a second die embedded in a first insulating material; a first redistribution structure over the first die and the second die, the first redistribution structure including a dielectric layer; a first conductive pad in physical contact with a first die connector of the first die; a second conductive pad in physical contact with a second die connector of the second die; a second insulating material extending partially through the first redistribution structure, where a material of the second insulating material is different from a material of the dielectric layer; a first via extending through the second insulating material to physically contact the first conductive pad; and a second via extending through the second insulating material to physically contact the second conductive pad. In an embodiment, the package structure further includes a silicon bridge coupled to the first via and the second via, where the first die is electrically connected to the second die through the silicon bridge. In an embodiment, the package structure further includes a package component electrically coupled to the first redistribution structure, where the first redistribution structure is disposed between the package component and the silicon bridge. In an embodiment, a first width of the silicon bridge in a direction that is parallel to a top surface of the second insulating material is smaller or equal to a smallest width of the second insulating material from a first outermost sidewall of the second insulating material to a second outermost sidewall of the second insulating material. In an embodiment the package structure further includes a package substrate coupled to the first redistribution structure, where the first redistribution structure is disposed between the package substrate and the first die. In an embodiment, the second insulating material has a dielectric constant that is in a range from 2.8 to 4.2. In an embodiment, the second insulating material has a silica filler content that is less than 70 percent by weight.

In accordance with an embodiment, a method of forming an integrated circuit package includes forming a first redistribution structure over a first die and a second die; performing an etching process to form an opening in the first redistribution structure over the first die and the second die; forming a first via and a second via in the opening, where the first via is electrically connected to the first die, and the second via is electrically connected to the second die; filling the opening with a molding material, where the molding material surrounds each of the first via and the second via; and coupling a silicon bridge to the first via and the second via. In an embodiment, after performing the etching process, the opening exposes a first contact pad and a second contact pad of the first redistribution structure, where the first contact pad is in physical contact with a first die connector of the first die, and the second contact pad is in physical contact with a second die connector of the second die. In an embodiment, forming the first via and the second via includes plating a conductive material on top surfaces of the first contact pad and the second contact pad, respectively. In an embodiment, the molding material has a dielectric constant that is in a range from 2.8 to 4.2. In an embodiment, after performing the etching process, the opening exposes a first die connector of the first die and a second die connector of the second die. In an embodiment, forming the first via and the second via includes plating a conductive material on top surfaces of a first die connector of the first die and a second die connector of the second die, respectively. In an embodiment, after forming the molding material in the opening, the molding material is in physical contact with the first die and the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:

a first die and a second die embedded in a first molding material;

a first redistribution structure over the first die and the second die;

a second molding material over portions of the first die and the second die, wherein the second molding material is disposed between a first portion of the first redistribution structure and a second portion of the first redistribution structure;

a first via extending through the second molding material, wherein the first via is electrically connected to the first die;

a second via extending through the second molding material, wherein the second via is electrically connected to the second die; and a silicon bridge electrically coupled to the first via and the second via.

2. The package of claim 1, wherein the first via is in physical contact with a first die connector of the first die, and the second via is in physical contact with a second die connector of the second die.

3. The package of claim 2, wherein the second molding material is in physical contact with the first die and the second die.

4. The package of claim 1, wherein a third portion of the first redistribution structure is disposed between the second molding material and both the first die and the second die.

5. The package of claim 4, wherein the first via is in physical contact with a first conductive pad in the third portion of the first redistribution structure, and the second via is in physical contact with a second conductive pad in the third portion of the first redistribution structure.

6. The package of claim 1, wherein a silica filler content of the second molding material is less than 70 percent by weight.

7. A package structure comprising:

a first die and a second die embedded in a first insulating material;

a first redistribution structure over the first die and the second die, the first redistribution structure comprising:

a dielectric layer;

a first conductive pad in physical contact with a first die connector of the first die;

a second conductive pad in physical contact with a second die connector of the second die;

a second insulating material extending partially through the first redistribution structure, wherein a material of the second insulating material is different from a material of the dielectric layer;

a first via extending through the second insulating material to physically contact the first conductive pad;

a second via extending through the second insulating material to physically contact the second conductive pad; and a silicon bridge coupled to the first via and the second via, wherein the first die is electrically connected to the second die through the silicon bridge.

8. The package structure of claim 7, further comprising:

a package component electrically coupled to the first redistribution structure, wherein the first redistribution structure is disposed between the package component and the silicon bridge.

9. The package structure of claim 7, wherein a first width of the silicon bridge in a direction that is parallel to a top surface of the second insulating material is smaller or equal to a smallest width of the second insulating material from a first outermost sidewall of the second insulating material to a second outermost sidewall of the second insulating material.

10. The package structure of claim 7, further comprising:

a package substrate coupled to the first redistribution structure, wherein the first redistribution structure is disposed between the package substrate and the first die.

11. The package structure of claim 7, wherein the second insulating material has a dielectric constant that is in a range from 2.8 to 4.2.

12. The package structure of claim 7, wherein the second insulating material has a silica filler content that is less than 70 percent by weight.

13. The package structure of claim 7, wherein the silicon bridge overlaps a portion of the first die and a portion of the second die.

14. A package comprising:

a first die and a second die embedded in a first molding material;

a first redistribution structure over the first die and the second die, wherein a first portion of the first redistribution structure is disposed over the first die, and a second portion of the first redistribution structure is disposed over the second die;

a second molding material disposed between the first portion of the first redistribution structure and the second portion of the first redistribution structure;

a silicon bridge disposed over the second molding material, wherein a first width of the silicon bridge in a direction that is parallel to a top surface of the second molding material is smaller or equal to a smallest width of the second molding material between a first outermost sidewall of the second molding material and a second outermost sidewall of the second molding material;

a first via extending through the second molding material, wherein the first via electrically connects the silicon bridge to the first die; and a second via extending through the second molding material, wherein the second via electrically connects the silicon bridge to the second die.

15. The package of claim 14, wherein the second molding material has a dielectric constant that is in a range from 2.8 to 4.2.

16. The package of claim 14, wherein the second molding material is in physical contact with the first die and the second die.

17. The package of claim 14, wherein a third portion of the first redistribution structure is disposed between the second molding material and both the first die and the second die.

18. The package of claim 14, wherein a silica filler content of the second molding material is less than 70 percent by weight.

19. The package of claim 14, further comprising:

a package substrate coupled to the first redistribution structure, wherein the first redistribution structure is disposed between the package substrate and the first die.

20. The package of claim 19, wherein the silicon bridge is disposed between package substrate and the first redistribution structure.

* * * * *